United States Patent
Lin et al.

(10) Patent No.: US 9,087,923 B2
(45) Date of Patent: Jul. 21, 2015

(54) MONOLITHIC COMPOUND SEMICONDUCTOR STRUCTURE

(71) Applicant: WIN Semiconductors Corp., Kuei Shan Hsiang, Tao Yuan Shien (TW)

(72) Inventors: Cheng-Kuo Lin, Tao Yuan Shien (TW); Szu-Ju Li, Tao Yuan Shien (TW); Rong-Hao Syu, Tao Yuan Shien (TW); Shu-Hsiao Tsai, Tao Yuan Shien (TW)

(73) Assignee: WIN SMICONDUTOR CORP., Kuei Shan Hsiang, Tao Yuan Shen (TC)

( * ) Notice: Subject to any disclaimer, the term of this patent is extended or adjusted under 35 U.S.C. 154(b) by 58 days.

(21) Appl. No.: 13/662,034

(22) Filed: Oct. 26, 2012

(65) Prior Publication Data
US 2013/0334564 A1 Dec. 19, 2013

(30) Foreign Application Priority Data
Jun. 13, 2012 (TW) .............................. 101121120 A

(51) Int. Cl.
*H01L 29/66* (2006.01)
*H01L 21/8252* (2006.01)
*H01L 29/205* (2006.01)
*H01L 27/06* (2006.01)
*H01L 29/737* (2006.01)
*H01L 29/87* (2006.01)

(52) U.S. Cl.
CPC ........ *H01L 21/8252* (2013.01); *H01L 27/0605* (2013.01); *H01L 27/0623* (2013.01); *H01L 29/205* (2013.01); *H01L 29/7371* (2013.01); *H01L 29/87* (2013.01)

(58) Field of Classification Search
CPC ................ H01L 27/0623; H01L 2924/1305; H01L 2924/13064; H01L 29/165; H01L 29/205; H01L 29/87; H01L 27/0605; H01L 29/7371; H01L 29/74
USPC ................. 257/133, 197, 194, 474, 192, 195; 438/235
See application file for complete search history.

(56) References Cited

U.S. PATENT DOCUMENTS

| | | | | |
|---|---|---|---|---|
| 6,737,684 | B1 * | 5/2004 | Takagi et al. | 257/194 |
| 7,242,038 | B2 * | 7/2007 | Oda et al. | 257/197 |
| 7,656,002 | B1 * | 2/2010 | Barratt et al. | 257/474 |
| 7,718,486 | B2 * | 5/2010 | Krutko et al. | 438/235 |
| 2002/0121647 | A1 * | 9/2002 | Taylor | 257/192 |
| 2004/0082091 | A1 * | 4/2004 | Taylor et al. | 438/39 |
| 2005/0139863 | A1 * | 6/2005 | Welser et al. | 257/197 |
| 2006/0141682 | A1 * | 6/2006 | Taylor et al. | 438/142 |
| 2007/0278523 | A1 * | 12/2007 | Lin et al. | 257/194 |
| 2008/0023725 | A1 * | 1/2008 | Cooke et al. | 257/192 |
| 2012/0104462 | A1 * | 5/2012 | Ichikawa | 257/194 |
| 2012/0175681 | A1 * | 7/2012 | Stevens et al. | 257/195 |

* cited by examiner

*Primary Examiner* — Mohammed Shamsuzzaman
(74) *Attorney, Agent, or Firm* — Muncy, Geissler, Olds & Lowe, P.C.

(57) ABSTRACT

A monolithic compound semiconductor structure is disclosed. The monolithic compound semiconductor structure comprises a substrate, an n-type FET epitaxial structure, an n-type etching-stop layer, a p-type insertion layer, and an npn HBT epitaxial structure, and it can be used to form an FET, an HBT, or a thyristor.

10 Claims, 3 Drawing Sheets

MONOLITHIC COMPOUND SEMICONDUCTOR STRUCTURE

FIELD OF THE INVENTION

The present invention relates to a monolithic compound semiconductor structure, and in particular, to a monolithic compound semiconductor structure integrating a heterojunction bipolar transistor (HBT), a field effect transistor (FET), and a thyristor for applications in electrostatic discharge (ESD) protection circuits.

BACKGROUND OF THE INVENTION

When a human body touches an integrated circuit, the accumulated electrostatic charges pass from the human body to the integrated circuit through the pins, and then the integrated circuit is discharged through the ground contact. The discharging process may produce a current of several amps within a few nanoseconds, leading to device degradation or damage. Therefore it is necessary to design an ESD protection system for the devices in an integrated circuit to sustain ESD events.

In monolithic compound semiconductor structures, ESD protection circuits are usually composed of p-n junction diodes or Schottky diodes due to the restriction caused by the vertically stacked layer structure. To achieve a high ESD protection level, several diodes connected in series are necessary and a larger die area is required. Besides, the turn-on voltage of a diode is small, which in turn limits the ESD protection level.

A silicon-controlled rectifier (SCR), also known as a thyristor, is a solid-state device with a four-layer pnpn structure commonly used in silicon integrated circuits. A SCR has a high turn-on voltage and a low holding voltage. When used in an ESD protection circuit, the SCR can clamp the voltage of the circuit in a lower level, such that the circuit can be effectively protected.

To achieve better device integration on a chip, a so-called BiHEMT structure that combines an HBT and an FET (or a high-electron-mobility transistor; HEMT) in a vertically stacked epitaxial structure has recently been developed for monolithic integrations of compound semiconductor devices. The HBT has either an npn or a pnp junction, while the FET/HEMT can be either n-type or p-type. If a four-layer pnpn junction can be formed in a BiHEMT structure, an epilayer structure that combines an SCR and a BiHEMT becomes possible. This can improve the ESD protection level while keeping the device area minimal.

SUMMARY OF THE INVENTION

The main object of the present invention is to provide a monolithic compound semiconductor structure, in which a n-type etching-stop layer and a p-type insertion layer are included in a BiFET structure, so that the epitaxial structure of an FET, an HBT, and a thyristor can be integrated in a compound semiconductor monolithic chip. The thyristor therein can be used in an ESD system. The surface area of a chip herewith is significantly reduced comparing with a conventional ESD system using diodes. Furthermore, the ESD performance can be improved, and thus the product competitiveness can be increased.

To reach the objects stated above, the present invention provides a monolithic compound semiconductor structure, which comprises a substrate, an FET epilayer structure, an n-type etching-stop layer, a p-type insertion layer, and an HBT epilayer structure. The FET epilayer structure is disposed on the substrate, comprising a channel layer and an n-type doped layer, in which the n-type doped layer is disposed on the channel layer, forming an n-type FET. The HBT epilayer structure comprises sequentially from top to bottom a sub-collector layer, a collector layer, a base layer, and an emitter layer. The sub-collector layer, the collector layer, and the emitter layer are n-type doped layers and the base layer is a p-type doped layer, and hence they form an npn HBT epilayer structure. The FET epilayer structure, the n-type etching-stop layer, the p-type insertion layer, and the sub-collector layer, the collector layer, and the base layer of the HBT epitaxial structure can be used to form a thyristor epitaxial structure with a pnpn junction.

In implementation, the n-type etching-stop layer described previously is formed of InGaP. The doping concentration in the n-type etching-stop layer is ranging from $1\times10^{15}$ cm$^{-3}$ to $1\times10^{22}$ cm$^{-3}$, and the thickness of said n-type etching-stop layer is between 50 Å to 5000 Å.

In implementation, the p-type insertion layer described previously comprises one or multiple p-type doped layer. The doping concentrations in neighboring p-type doped layers in the p-type insertion layer are different to each other. The doping concentration in each p-type doped layer of the p-type insertion layer is ranging from $1\times10^{15}$ cm$^{-3}$ to $1\times10^{22}$ cm$^{-3}$, and the thickness of each p-type doped layer of said p-type insertion layer is between 500 Å and 20000 Å.

In implementation, the p-type insertion layer described previously comprises a p+ doped layer and a p− doped layer. The p+ doped layer is a heavily doped p-type layer, and the p− doped layer is a lightly doped p-type layer. The p− doped layer is formed on said p+ doped layer.

In implementation, the p+ doped layer and the p− doped layer described previously are formed of GaAs.

In implementation, the doping concentration of the p+ doped layer described previously is ranging from $1\times10^{18}$ cm$^{-3}$ to $1\times10^{22}$ cm$^{-3}$, and the thickness of the p+ doped layer is between 1000 Å and 2000 Å.

In implementation, the doping concentration in the p− doped layer described previously is ranging from $1\times10^{16}$ cm$^{-3}$ to $1\times10^{17}$ cm$^{-3}$, and the thickness of the p− doped layer is between 2500 Å and 15000 Å.

In implementation, the FET epitaxial structure described previously is an n-type metal semiconductor FET (MESFET) epitaxial structure.

In implementation, the FET epitaxial structure described previously is an n-type high electron mobility transistor (HEMT) epitaxial structure.

In implementation, the FET epitaxial structure described previously is an n-type pseudomorphic high electron mobility transistor (pHEMT) epitaxial structure.

In implementation, the substrate described previously is formed of GaAs or InP.

For further understanding the characteristics and effects of the present invention, some preferred embodiments referred to drawings are in detail described as follows.

DETAILED DESCRIPTIONS OF PREFERRED EMBODIMENTS

Figure 1:
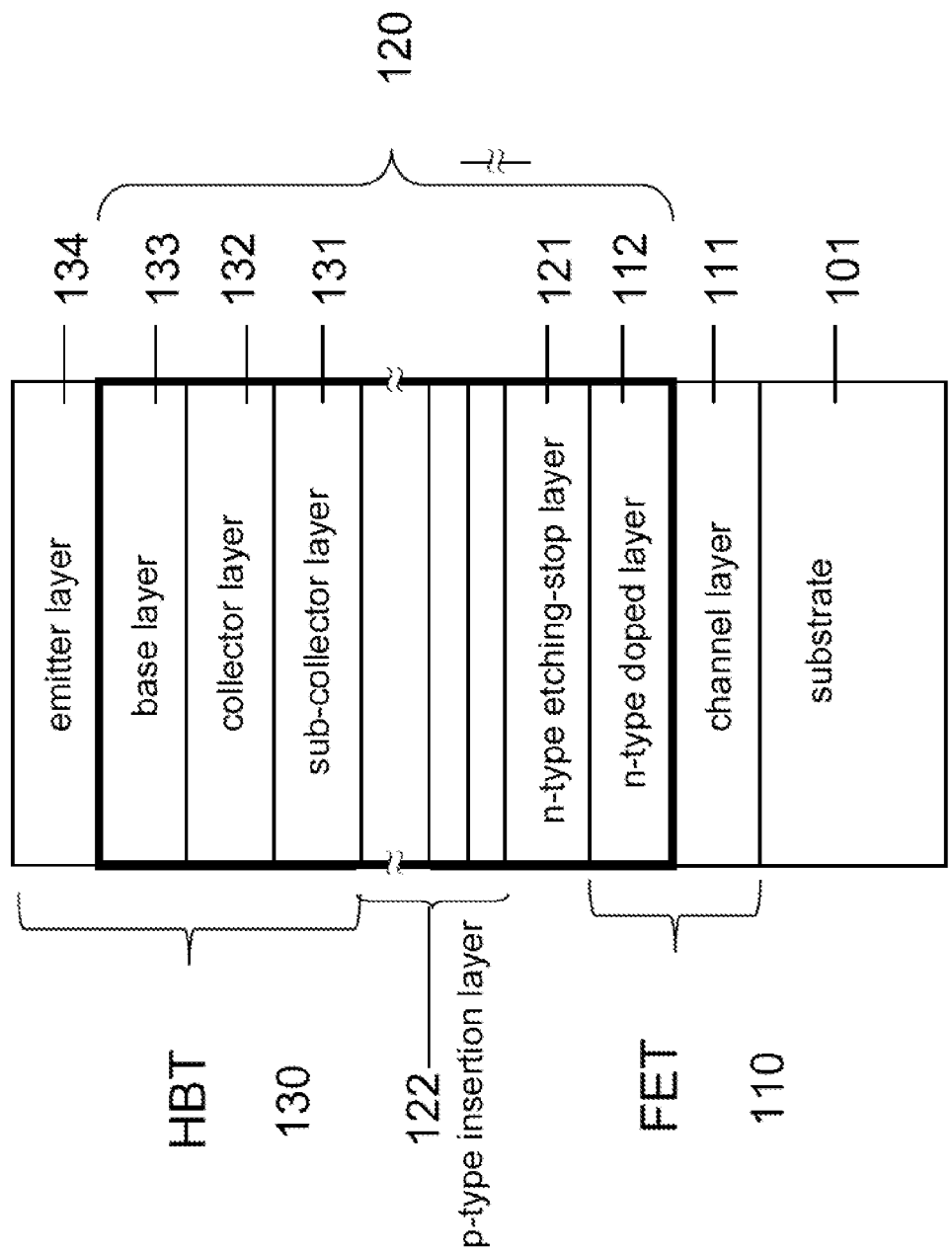
FIG. 1 is a schematic showing the cross-sectional view of the monolithic compound semiconductor structure provided by the present invention

The monolithic compound semiconductor structure integrating the epitaxial structure of an FET, an HBT, and a thyristor provided by the present invention is shown schematically in FIG. 1. The structure comprises a substrate 101, an FET epitaxial structure 110, an n-type etching-stop layer 121, a p-type insertion layer 122, and an HBT epitaxial structure 130. The substrate 101 is made of a semi-insulating semiconductor material such as GaAs or InP, and the preferred material is GaAs. The FET epitaxial structure 110 is formed on the substrate 101. It comprises a channel layer 111, and an n-type doped layer 112 formed on the channel layer 111. The structure can be used to form an n-type FET. The n-type etching-stop layer 121 is formed on the FET epitaxial structure 110. The p-type insertion layer 122 is formed on the n-type etching-stop layer 121. The HBT epitaxial structure 130 from bottom to top sequentially comprises a sub-collector layer 131, a collector layer 132, a base layer 133, and an emitter layer 134. The sub-collector layer 131, the collector layer 132, and the emitter layer 134 are made of n-type doped layers and the base layer 133 is made of p-type doped layer, forming an npn HBT epitaxial structure. Hence the monolithic compound semiconductor has a npnpn structure from top to bottom, in which the pnpn structure for a thyristor 120 is included that is, the n-type FET epitaxial structure, the n-type etching-stop layer, the p-type insertion layer, and the p-type base layer, the n-type collector layer, and the n-type sub-collector layer of the HBT epitaxial structure.

Figure 2:
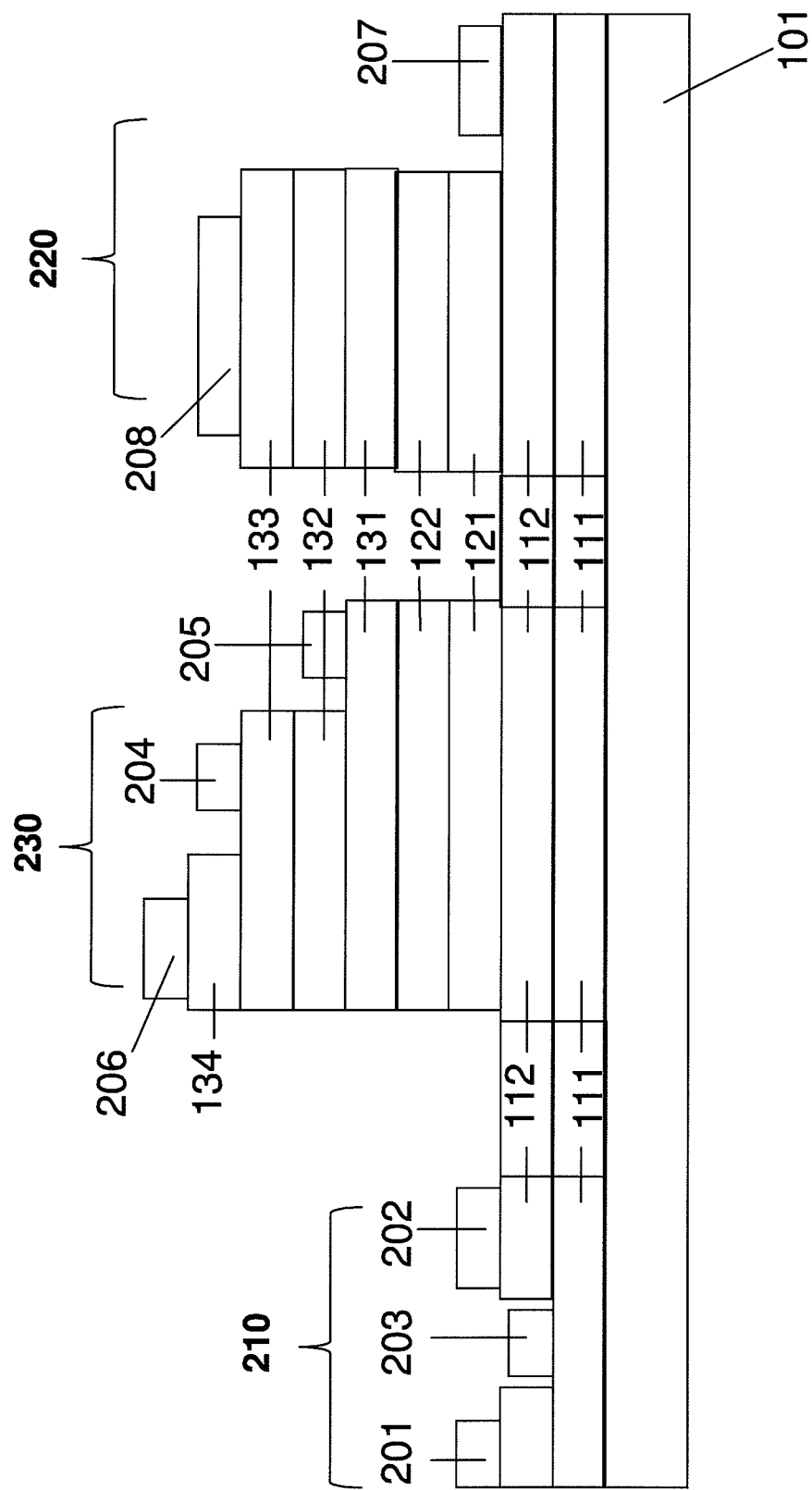
FIG. 2 is a schematic showing the cross-sectional view of compound semiconductor devices formed by using the monolithic compound semiconductor structure provided by the present invention.

In implementation, the FET epitaxial structure 110 can be an n-type metal semiconductor FET (MESFET), an n-type high electron mobility transistor (HEMT), an n-type pseudomorphic high electron mobility transistor (pHEMT), or any n-type FET of other types. The n-type etching-stop layer 121 is formed preferably of InGaP. The doping concentration in the n-type etching-stop layer 121 can be ranging from $1\times10^{15}$ $cm^{-3}$ to $1\times10^{22}$ $cm^{-3}$ preferably in the range from $1\times10^{17}$ $cm^{-3}$ to $1\times10^{18}$ $cm^{-3}$. The thickness of the n-type etching-stop layer 121 is between 50 Å to 5000 Å, preferably from 100 Å to 500 Å. The p-type insertion layer 122 can comprise one or multiple p-type doped layers. The doping concentrations in p type doped layers neighboring the p-type insertion layer 122 are different to each other. The doping concentration in each p type doped layer of the p-type insertion layer 122 is ranging from $1\times10^{15}$ $cm^{-3}$ to $1\times10^{22}$ $cm^{-3}$, and the thickness of each p-type doped layer is preferably between 500 Å and 20000 Å. The HBT epitaxial structure 130 is made preferably of GaAs. The doping concentration in the sub-collector layer 131 can be ranging from $1\times10^{15}$ $cm^{-3}$ to $1\times10^{22}$ $cm^{-3}$, preferably a high doping concentration ranging from $1\times10^{18}$ $cm^{-3}$ to $1\times10^{22}$ $cm^{-3}$. When employing in a semiconductor device, as shown in FIG. 2, a source electrode 201 and a drain electrode 202 can be disposed on the n-type doped layer 112 of the previously described integrated structure, and a gate electrode 203 can be disposed in the recess on the n-type doped layer 112 between the source electrode 201 and the drain electrode 202 connecting the channel layer 111. The channel layer 111, the n-type doped layer 112, the source electrode 201, the drain electrode 202, and the gate electrode 203 form an n-type FET 210. By disposing a base electrode 204 on the base layer 133 of the previously described integrated structure, a collector electrode 205 on the sub-collector layer 131, and a emitter electrode 206 on the emitter layer 134, the sub-collector layer 131, the collector layer 132, the base layer 133, the emitter layer 134, the base electrode 204, the collector electrode 205, and the emitter electrode 206 can then be used to form an HBT 230. By disposing an anode electrode 207 on the base layer 133 and cathode electrode 208 on the n-type doped layer 112, the n-type doped layer 112, the n-type etching-stop layer 121, the p-type insertion layer 122, the sub-collector layer 131, the collector layer 132, the base layer 133, the anode electrode 207, and the cathode electrode 208 can then be used to form a thyristor 220.

Table 1 shows an embodiment of a monolithic compound semiconductor structure provided by the present invention. In the embodiment a substrate and 14 epitaxial layers above a substrate are included. The first and the second layers from top to bottom are a heavily doped emitter contact layer and a cap layer. The third to the sixth layers are emitter layers which comprises multiple n-type doped layers of different thickness and doping concentration. The seventh layer is a base layer, which is a heavily doped p-type layer. The eighth to the tenth layers are an n-type doped collector layer and an n+ sub-collector layer. The eleventh and the twelfth layers are p-type doped layer, which is a p+ doped layer and a p− doped layer formed of GaAs. The p+ doped layer is a heavily doped p-type layer and the p− doped layer is a lightly doped p-type layer disposed on the p+ doped layer. The doping concentration in the p+ doped layer can be selected to be ranging from $1\times10^{18}$ $cm^{-3}$ to $1\times10^{22}$ $cm^{-3}$, and its thickness can be ranging from 1000 Å to 20000 Å. In this embodiment, the doping concentration in the p+ doped layer is selected to be $1\times10^{18}$ $cm^{-3}$ and the thickness is selected to be 1000 Å. The doping concentration in the p− doped layer can be ranging from $1\times10^{16}$ $cm^{-3}$ to $1\times10^{17}$ $cm^{-3}$, and its thickness can be ranging from 2500 Å to 15000 Å. In this embodiment, the doping concentration in the p− doped layer is selected to be $1\times10^{16}$ $cm^{-3}$ and the thickness is selected to be 2500 Å. The thirteenth layer is an n-type etching-stop layer formed of InGaP. Its doping concentration is selected to be $3\times10^{17}$ $cm^{-3}$, and its thickness is selected to be 200 Å. The fourteenth layer is an n+ layer. Its doping concentration is selected to be $4\times10^{18}$ $cm^{-3}$, and its thickness is selected to be 4000 Å. The structure from the seventh to the fourteenth layers is a pnpn structure and can be used to form a thyristor.

Figure 3:
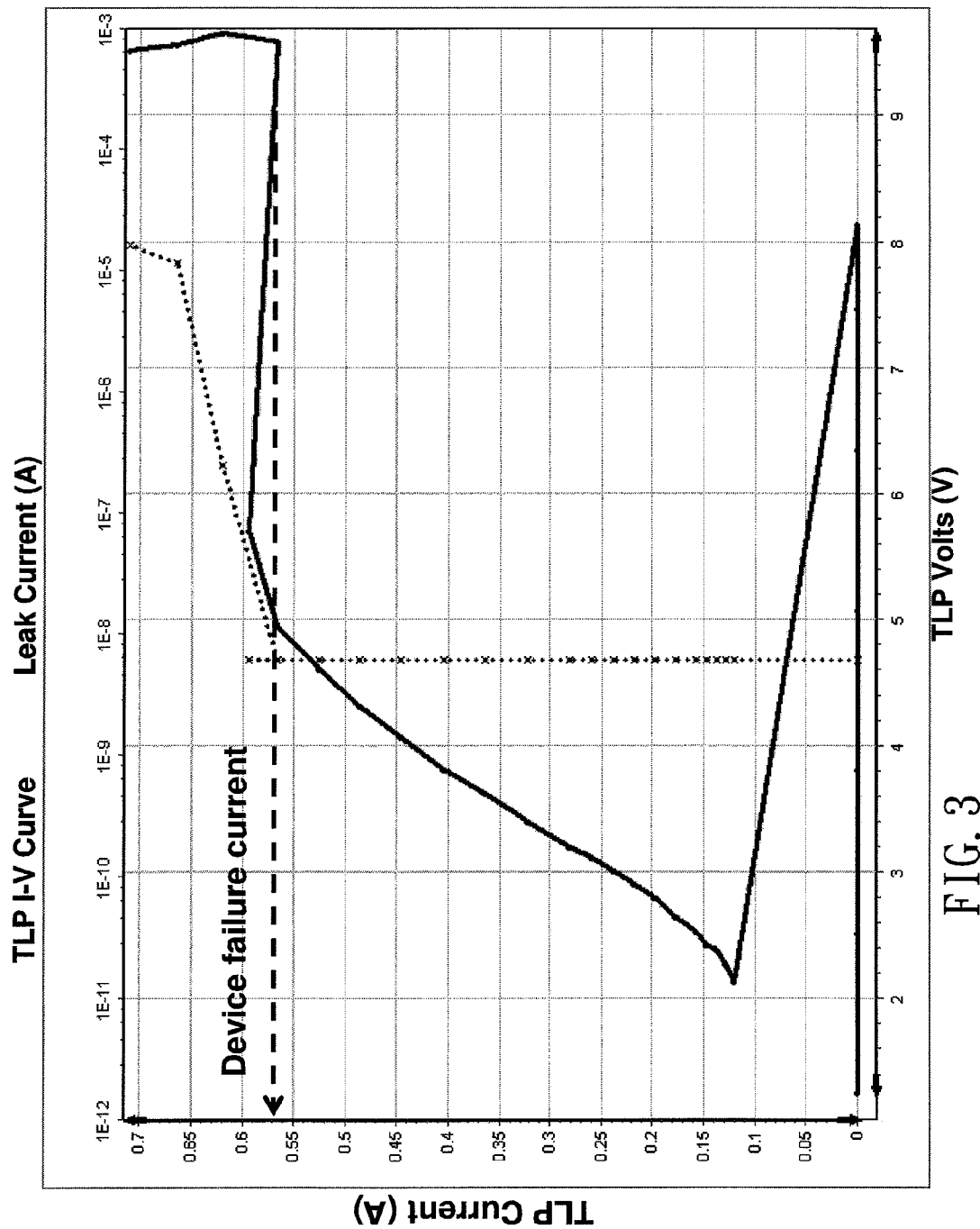
FIG. 3 is a diagram showing the I-V curves of a thyristor provided by the present invention in a TLP test.

The ESD protection performance of a semiconductor integrated circuit can be characterized by using the transmission line pulse (TLP) testing, in which high current pulses are applied to the tested circuit. An I-V curve of the tested circuit can be obtained by analyzing the incident and reflected pulses. The energy range and the pulse width of the incident high current pulses are similar to the human body model (HBM). FIG. 3 shows the I-V curves of a thyristor provided by the present invention (solid line) under the TLP test, comparing with the I-V curves of series-connected diodes (dashed line) under the TLP test. The figure shows that the trigger voltage of the thyristor provided by the present invention is about 8 V, the holding voltage is about 2 V, and the device failure current is about 0.57 Å. Comparing with the TLP test I-V curves of an ESD protection circuit using series-connected diodes in a previous technology, the thyristor provided by the present invention has a higher trigger voltage and a lower holding voltage across the circuit after being triggered. The trigger voltage and the holding voltage of the thyristor are related to the thickness and the doping concentration of the p-type insertion layer. The ESD protection performance of the device can be improved by adjusting the thickness and the doping concentration in the p-type insertion layer.

To sum up, the present invention can indeed get its anticipated object to provide a monolithic compound semiconductor integrating the epitaxial structure of an FET, an HBT, and a thyristor. The thyristor made of the monolithic structure provided by the present invention can be applied in ESD protection circuits. The required area for an ESD circuit can therefore be significantly reduced. Furthermore, the higher trigger voltage, the lower holding voltage, the lower power dissipation, and the higher current handling capability of a thyristor considerably improve the performance of ESD protections. Besides, the fabrication process of the present invention is compatible with the current fabrication processes of BiHEMT technologies, and therefore the production cost can be significantly reduced.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

TABLE 1

| layer | epitaxial layer type | Layer structure | Dopant type | thickness (Å) | Doping concentration (cm$^{-3}$) |
|---|---|---|---|---|---|
| 1 | n+ narrow-gap emitter contact | In$_{0.5}$Ga$_{0.5}$As | n | 450 | >1 × 10$^{19}$ |
| 2 | graded cap | In$_{0.5}$Ga$_{0.5}$A to GaAs | n | 350 | >1 × 10$^{19}$ |
| 3 | n+ emitter transition | GaAs | n | 700 | 5 × 10$^{18}$ |
| 4 | n− emitter transition | GaAs | n | 1000 | 1 × 10$^{16}$ |
| 5 | n+ emitter transition | GaAs | n | 200 | 5 × 10$^{18}$ |
| 6 | n wide-gap emitter | In$_{0.5}$Ga$_{0.5}$P | n | 400 | 3 × 10$^{17}$ |
| 7 | p+ base | GaAs | p | 700 | 4 × 10$^{19}$ |
| 8 | n− collector | GaAs | n | 6000 | 1 × 10$^{16}$ |
| 9 | n− collector | GaAs | n | 2000 | 4 × 10$^{16}$ |
| 10 | n+ sub-collector | GaAs | n | 4000 | 5 × 10$^{18}$ |
| 11 | p− doped | GaAs | p | 2500 | 1 × 10$^{16}$ |
| 12 | p+ doped | GaAs | p | 1000 | 1 × 10$^{18}$ |
| 13 | etching-stop | In$_x$Ga$_{1-x}$P | n | 200 | 3 × 10$^{17}$ |
| 14 | n+ doped | GaAs | n | 4000 | 4 × 10$^{18}$ |
| | substrate | GaAs | — | 675 ± 25 (μm) | — |

The invention claimed is:

1. A monolithic compound semiconductor structure integrating a heterojunction bipolar transistor (HBT), a field effect transistor (FET), and a thyristor structure, comprising:
    a substrate;
    an FET structure formed on said substrate, which comprises
    a channel layer and
    an n-type doped layer formed directly on said channel layer;
    an n-type etching-stop layer;
    a p-type insertion layer, formed directly on said n-type etching-stop layer; and
    an HBT structure formed directly on said p-type insertion, which comprises
    a sub-collector layer made of an n-type doped layer, a collector layer made of an n-type doped layer and formed directly on said sub-collector layer, a base layer made of an p-type doped layer and formed directly on said collector layer, and
    an emitter layer made of an n-type doped layer and formed directly on said base layer, wherein said p-type insertion layer comprises multiple p-type doped layers; a doping concentration in neighboring p-type doped layers of said p-type insertion layer is different to each other; the doping concentration of each p-type doped layer of said p-type insertion layer is ranging from 1×10$^{15}$ cm$^{-3}$ to 1×10$^{22}$ cm$^{-3}$ and a thickness of each p-type doped layer of said p-type insertion layer is between 500 Å and 20000 Å, and
    wherein said FET structure, said n-type etching-stop layer, said p-type insertion layer and said sub-collector layer, said collector layer, and said base layer of said HBT structure form the thyristor structure.

2. The monolithic compound semiconductor structure according to claim 1, wherein said n-type etching-stop layer is formed of InGaP; a doping concentration of said n-type etching-stop layer is equal to or higher than 1×10$^{15}$ cm$^{-3}$ and equal to or lower than 1×10$^{22}$ cm$^{-3}$; and a thickness of said n-type etching-stop layer is between 50 Å to 5000 Å.

3. The monolithic compound semiconductor structure according to claim 1, wherein said p-type insertion layer comprises a p+ doped layer and a p− doped layer; said p+ doped layer is a heavily doped p-type layer, and said p− doped layer is a lightly doped p-type layer; said p− doped layer is formed on said p+ doped layer.

4. The monolithic compound semiconductor structure according to claim 3, wherein said p+ doped layer and said p− doped layer are formed of GaAs.

5. The monolithic compound semiconductor structure according to claim 3, wherein a doping concentration in said p+ doped layer is ranging from 1×10$^{18}$ cm$^{-3}$ to 1×10$^{22}$ cm$^{-3}$ and a thickness of said p+ doped layer is between 1000 Å and 2000 Å.

6. The monolithic compound semiconductor structure according to claim 3, wherein a doping concentration in said p− doped layer is ranging from 1×10$^{16}$ cm$^{-3}$ to 1×10$^{17}$ cm$^{-3}$, and a thickness of said p− doped layer is between 2500 Å and 15000 Å.

7. The monolithic compound semiconductor structure according to claim 1, wherein said FET structure is an n-type metal semiconductor FET (MESFET) structure.

8. The monolithic compound semiconductor structure according to claim 1, wherein said FET structure is an n-type high electron mobility transistor (HEMT) structure.

9. The monolithic compound semiconductor structure according to claim 1, wherein said FET structure is an n-type pseudomorphic high electron mobility transistor (pHEMT) structure.

10. The monolithic compound semiconductor structure according to claim 1, wherein said substrate is formed of GaAs or InP.

* * * * *